United States Patent [19]
Beetz, Jr. et al.

[11] Patent Number: 5,122,509
[45] Date of Patent: Jun. 16, 1992

[54] HIGH TEMPERATURE SUPERCONDUCTOR/DIAMOND COMPOSITE ARTICLE, AND METHOD OF MAKING THE SAME

[75] Inventors: Charles P. Beetz, Jr., New Milford; Peter S. Kirlin, Brookfield, both of Conn.

[73] Assignee: Advanced Technology Materials, Inc., Danbury, Conn.

[21] Appl. No.: 516,156

[22] Filed: Apr. 30, 1990

[51] Int. Cl.⁵ .............................................. B32B 9/00
[52] U.S. Cl. ........................................ 505/1; 505/701; 505/702; 505/703; 505/704; 428/408; 428/411.1; 428/457; 428/688; 428/698; 428/930
[58] Field of Search ............................ 505/1, 701–704; 428/408, 411.1, 457, 688, 698, 901, 930

[56] References Cited

U.S. PATENT DOCUMENTS

| | | | |
|---|---|---|---|
| 4,299,861 | 11/1981 | Dietesch et al. | 505/819 |
| 4,935,385 | 6/1990 | Biegelsen | 437/111 |
| 4,954,479 | 9/1990 | Dubots et al. | 505/1 |
| 4,959,279 | 9/1990 | Tanaka et al. | 428/660 |
| 4,959,346 | 9/1990 | Mogro-Campero et al. | 505/1 |
| 4,966,142 | 10/1990 | Zimmerman et al. | 228/179 |
| 4,971,948 | 11/1990 | Dam et al. | 505/1 |

FOREIGN PATENT DOCUMENTS

| | | |
|---|---|---|
| 0304061 | 2/1989 | European Pat. Off. |
| 1-157009 | 6/1989 | Japan |

OTHER PUBLICATIONS

Journ. Appl. Phys., vol. 66, No. 9, Nov. 1, 1989, pp. 4551–4554, Brasures et al., Contruction . . . Bolometer.
Amer. Inst. of Physics, No. 165, 1987.
CA 110 (4): 32333s, HTSC YBaCuO film on SiC semiconductor substrates, Andreev et al. (1988).

*Primary Examiner*—Patrick J. Ryan
*Attorney, Agent, or Firm*—Steven J. Hultquist

[57] ABSTRACT

A multilayer superconducting thin film composite article, comprising a carbon-containing substrate, and an interlayer comprising a material selected from the group consisting of zirconium, yttrium, niobium, and carbides and oxides thereof, platinum, iridium, gold, palladium, and silver, and an overlayer comprising an HTSC material. The carbon-containing substrate preferably comprises diamond and the interlayer preferably comprises a zirconium carbide sub-layer at the interface with the substrate, an intermediate sub-layer of zirconium metal, and an outer sub-layer of zirconium oxide at the interface with the HTSC material overlayer. The superconducting thin film material may comprise a copper oxide HTSC material, with YBaCuO, TlBaCaCuO, and BiSrCaCuO HTSC materials being preferred. The interlayer accommodates formation of the superconducting film in an oxic environment at elevated temperature without destruction of the substrate, while at the same time protecting the HTSC material in the overlayer from deleterious reaction with the substrate which otherwise may cause the HTSC material or precursor thereof to be highly resistive, i.e., non-superconducting, in character. The invention thus permits the fabrication of devices incorporating HTSC films with carbon-containing substrates such as diamond, including high operating temperature bolometers, and high power, high speed switching devices.

24 Claims, 6 Drawing Sheets

HIGH TEMPERATURE SUPERCONDUCTOR/DIAMOND COMPOSITE ARTICLE, AND METHOD OF MAKING THE SAME

This invention was made with Government support under Contract Number NAS5-30598 awarded by the National Aeronautics and Space Administration. The Government has certain rights in this invention.

BACKGROUND OF THE INVENTION

1. Field of the Invention

This invention relates to composite materials comprising a carbon-containing substrate, such as diamond, graphite, or metal carbide, and a high temperature superconducting thin film, as well as to a method of making such composite articles.

2. Description of The Related Art

The recent discovery of high temperature superconductor (HTSC) materials of the copper oxide type and the evolution of techniques for depositing thin films of such materials has led to the consideration of utilizing HTSC films in applications such as high (operating) temperature bolometers, and high power, high speed switching devices, as well as a wide variety of other end-use devices and applications.

The HTSC materials contemplated for such applications include various types of materials, such as metal oxide superconductors comprising admixtures of metals from Groups IB, IIA and IIIB of the Periodic Table, which may be applied in thin films by metal-organic chemical vapor deposition (MOCVD) techniques. Illustrative materials of such type include superconductor materials based on copper oxide, including thallium- and bismuth-containing materials.

Concurrently, low pressure chemical vapor deposition (CVD) methods for forming diamond layers have been developed, leading to the possibility that both HTSC and diamond materials in thin film form could be utilized in applications such as high operating temperature bolometers.

Structurally, the capability to form diamond thin films at low pressure and low temperature CVD conditions together with the ability to form thin film MOCVD layers of HTSC materials facilitates the construction of a bolometer consisting of a support frame, e.g., formed of silicon, a diamond film support for an HTSC transition edge thermometer, and an absorber film of a thin metal (e.g., bismuth) or carbon on one side thereof.

In such bolometer application, the HTSC material operating near the mid-point of the superconducting transition temperature range has a large value of beta ($=1/R(dR/dT)$), where R=resistance and T=temperature, and the bolometer device comprising such material therefore has the potential to be significantly more sensitive than conventional detector devices such as pyroelectrics and Golay cells in the far infrared spectral region.

Other potential end-use applications which are advantaged by the special properties of diamond and HTSC materials include high speed, high power switching devices, as well as various other applications of diamond and HTSC materials which are likely to be developed in the future as a consequence of the high thermal conductivity characteristics of diamond.

Materials compatibility presents a significant obstacle to the concurrent utilization of HTSC materials and diamond in device applications. In instances where HTSC material layers are sought to be formed on diamond substrates, the diamond component must be able to withstand processing conditions involved in both deposition and annealing of the HTSC film, without adverse affect on the structure or properties of the diamond substrate. Specifically, the high temperature oxygen annealing or high temperature water annealing or the growth of films under oxidizing conditions, as required to render the HTSC material superconducting in character, also have the potential to oxidize and degrade the diamond substrate surface.

Figure 1:
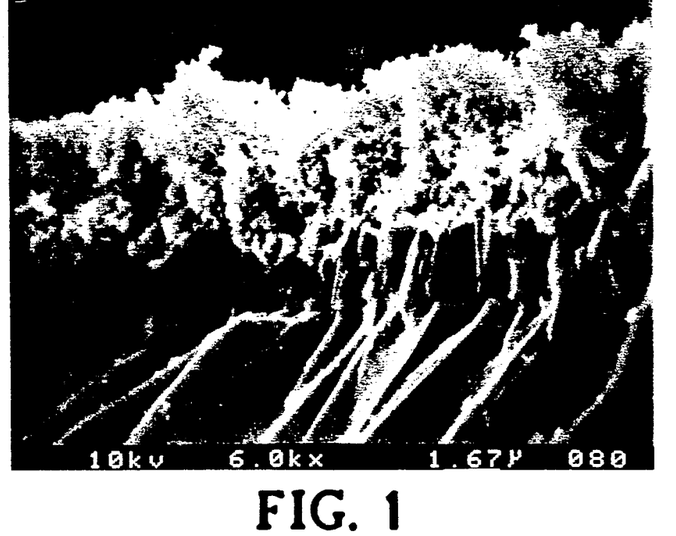
FIG. 1 is an SEM micrograph of a YBaCuOF/-diamond/Si composite, taken at a voltage of 10 KV and a magnification of 6000 times.
Figure 2:
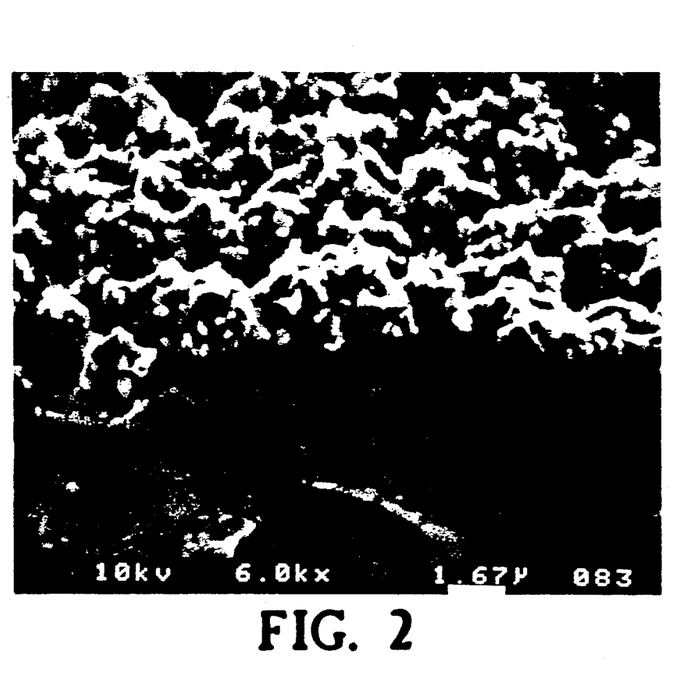
FIG. 2 is an SEM micrograph of a YBaCuO/-diamond/Si composite which is formed by high temperature annealing of a composite of the type shown in FIG. 1 (maximum annealing temperature = 910° C.), in the presence of oxygen.

As an example of the problems encountered in forming HTSC material films on diamond substrates (with the diamond being either in bulk crystal or thin film form), attempts were made by the inventors to prepare superconducting HTSC material films on a diamond layer that had been deposited on a silicon substrate. In order to prepare a superconducting film of HTSC material of the formula $YBa_2Cu_3O_{7-x}$ wherein x is a number from 0 to 1, a film of the fluorine-containing precursor material YBaCuOF was deposited and then annealed in the presence of oxygen at elevated temperature to form the material film. FIG. 1 is a scanning electron microscope (SEM) micrograph of the initially deposited YBaCuOF HTSC film on the diamond-coated silicon substrate. This micrograph, taken at a voltage of 10 KV and magnification of 6000 times (the scale is shown by the line in the bottom right hand portion of the micrograph, representing a distance of 1.67 microns), revealed that the diamond film remained intact during the growth of the precursor fluorine-containing film. The subsequent annealing of the YBaCuOF/diamond/Si composite was carried out at a maximum temperature of 910° C. in oxygen, pursuant to a protocol described in Chan, S. W., et al, "Effect of the post-deposition processing ambient on the preparation of superconducting $YBa_2Cu_3O_{7-x}$ thin films using $BaF_2$ source," *Appl. Phys. Lett*, 1988, 53, 1443. This protocol is known to optimize the properties of the resulting $YBa_2Cu_3O_{7-x}$ film, but such annealing procedure resulted in the complete destruction of the diamond thin film on which the HTSC film was deposited. Such destruction of the diamond thin film is shown in FIG. 2, which is an SEM micrograph, taken at a voltage of 10 KV and magnification of 6000 times (the scale of the micrograph is shown by the line in the bottom right-hand portion of the micrograph, representing a distance of 1.67 microns), of the $YBa_2Cu_3O_{7-x}$/diamond/Si composite after high temperature annealing.

Figure 3:
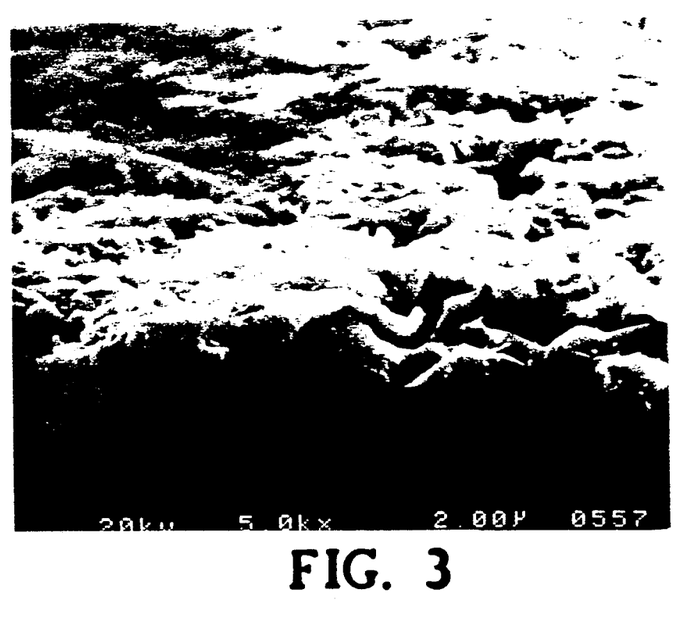
FIG. 3 is an SEM micrograph of a YBaCuO/-diamond/Si composite formed by annealing of a composite of the type shown in FIG. 1, at low temperature (maximum temperature = 700° C.) in the presence of oxygen.

In an effort to solve this diamond destruction problem, annealing of the precursor YBaCuO film was carried out at lower temperatures on the order of from about 550° C. to about 750° C., in the presence of oxygen. The resulting YBaCuO/diamond/Si composite is shown in the SEM micrograph of FIG. 3, which was taken at a voltage of 20 KV and magnification of 5000 times, with the scale of the photograph being shown by the line in the bottom right-hand portion thereof, representing a dimension of 2.0 microns. This micrograph shows that the degradation of the diamond film was minimal during the annealing process. Unfortunately, the YBaCuO film remained highly resistive in character and did not become superconducting. Although the exact reason for the failure of the copper oxide material to become superconducting is not known with certainty, it is speculated that some carbon dioxide was liberated by the decomposition of the diamond material during the annealing process, which reacted with the barium oxide (BaO) in the YBaCuO film to yield $BaCO_3$, which in turn inhibited the formation of the superconducting phase from the YBaCuO material. Regardless of the specific mechanism of the failure of the YBaCuO film to become superconducting in character, the fact remained that a superconducting HTSC material was not produced.

Thus, at high annealing temperatures which are operative to form HTSC films from the precursor YBaCuO material, the diamond underlying the HTSC layer is destroyed. At lower annealing temperatures which avoid significant damage to the diamond substrate, superconductivity characteristics are not achieved in the copper oxide precursor film. These problems pose a formidable obstacle to integrated usage of diamond and HTSC films in electronic device applications.

As an alternative to depositing precursor films of HTSC materials on substrates at low temperatures (below 700° C.) and then annealing the precursor film in oxygen to produce the superconducting HTSC material, it is known to grow superconducting thin films in situ by various techniques. Nonetheless, forming superconducting thin films by in situ growth techniques without an annealing step requires very strong oxidizing atmospheres. As described in Fujita, J. et al, "Epitaxial film growths of artificial (Bi-O)/(Sr-Ca-Cu-O) layered structures," *Appl. Phys. Lett.*, 1984 54, 2364; Satoh, T. et al, "As-grown superconducting Bi-Sr-Ca-Cu-O thin films by coevaporation," *Appl. Phys. Lett.*, 1989, 55, 702; and Singh, R. K., "In situ processing of epitaxial Y-Ba-Cu-O high $T_c$ superconducting films on (100) $SrTiO_3$ and (100) $YS-ZrO_2$ substrates at 500°–650° C.," *Appl. Phys. Lett.*, 1989, 54, 2271, oxygen plasmas may be employed for in situ HTSC film growth below 700° C. Alternatively, ozone may be employed in in situ HTSC film growth below 700° C., as described in Berkley, D. C., et al, "In situ formation of superconducting $YBa_2Cu_3O_{7-x}$ thin films using pure ozone vapor oxidation," *Appl. Phys. Lett.*, 1988, 53, 1973. It is already known that oxygen plasmas are effective etchants for natural Type II-A diamonds at 25° C. (see Sandhu, G. S., et al "Reactive ion etching of diamond," *Appl. Phys. Lett.*, 1989, 55, 437), and it can therefore be expected that ozone will correspondingly erode the diamond surface at moderate temperatures. Consequently, although process temperatures required for forming superconducting thin films of HTSC materials can be reduced by oxygen plasma or ozone methods, the enhanced reactivity in the in situ growth environment attendant the use of oxygen plasmas or ozone will degrade the diamond film.

In sum, the technology and techniques heretofore employed for formation of HTSC films preclude the integration of HTSC films with diamond substrates, and thus have prevented the formation of HTSC/diamond composites such as would otherwise be highly desirable for electronic device applications. Such problems facing the effective integration of diamond and HTSC films are also likely to be encountered in the integration of HTSC films with carbon-containing materials other than diamond, such as silicon carbide, titanium carbide, graphite, etc.

Accordingly, it is an object of the present invention to provide a composite article comprising a carbon-containing material substrate and HTSC layer, wherein the problems attendant the prior attempts at integrating HTSC materials and such substrate materials is overcome.

It is another object of the present invention to provide a method of making or forming composite articles comprising carbon-containing substrates and HTSC layers, which accommodate the aforementioned techniques for forming superconducting HTSC layers (i.e., deposition of precursor copper oxide films and annealing in an oxic environment, or in situ superconducting thin film growth techniques) without adverse affect on the carbon-containing substrate material.

Other objects and advantages of the present invention will be more fully apparent from the ensuing disclosure and appended claims.

SUMMARY OF THE INVENTION

In one aspect, the present invention relates to a multilayer superconducting thin film composite article, comprising:

(a) a substrate formed of a carbon-containing material;

(b) an interlayer comprising a material selected from the group consisting of zirconium; yttrium; niobium; zirconium carbide; yttrium carbide; niobium carbide; zirconium oxide; yttrium oxide; niobium oxide; platinum; palladium; iridium; gold; silver; and combinations of two or more such materials; and (c) an overlayer of an HTSC material on the interlayer.

The carbon-containing substrate material may for example comprise diamond, silicon carbide, titanium carbide, and/or graphite, as well as other carbon-containing materials.

The HTSC material may be of any suitable high temperature superconductor material, with metal oxide superconductors of the yttrium-barium-copper type ($YBa_2Cu_3O_{7-x}$, wherein x is 0 to 1), and bismuth-containing type, generally being most preferred.

In another aspect, the present invention relates to a method of making a superconducting thin film composite article, comprising the steps of:

(a) providing a substrate formed of a carbon-containing material;

(b) forming on the substrate an interlayer comprising a material selected from the group consisting of: zirconium; yttrium; niobium; zirconium carbide; yttrium carbide; niobium carbide; zirconium oxide; yttrium oxide; niobium oxide; platinum; palladium; iridium; gold; silver; and combinations of two or more such materials; and (c) forming on the interlayer a layer of an HTSC material.

The formation of the HTSC layer in the method described in the preceding paragraph may suitably comprise depositing a layer of a precursor material for the HTSC material, and annealing such layer at elevated temperature in an oxic, i.e., oxygen-containing, environment, such as in the presence of: oxygen; water; oxygen and water; ozone; and/or nitrogen oxides (e.g., NO or $NO_2$) Alternatively, the HTSC material layer may be formed by in situ growth techniques utilizing oxygen plasmas or ozone processes.

A preferred interlayer material in the composite article and method of the invention as broadly described above comprises a zirconium interlayer including a zirconium carbide sub-layer at the interface with the carbon-containing substrate material, and a zirconium oxide sub-layer at the interface with the HTSC layer. Such layer is formed by depositing zirconium on the substrate under conditions such that the zirconium metal will react with the substrate material to form the carbide sub-layer, with the exterior surface of the zirconium layer subsequently being oxidized to form the zirconium oxide sub-layer at the interface with the HTSC material. As an alternative to oxidizing the metal interlayer in situ to form the oxide sub-layer at the surface thereof, a metal oxide layer may be deposited on the previously deposited layer of the metal itself, to provide the metal-oxide portion of the interlayer at the interface with the HTSC material.

Other aspects and features of the invention will be more fully apparent from the ensuing disclosure and appended claims.

DETAILED DESCRIPTION OF THE DRAWINGS

DETAILED DESCRIPTION OF THE INVENTION, AND PREFERRED EMBODIMENTS THEREOF

The present invention is based on the discovery that a thin interlayer of specific material composition may be employed between a carbon-containing substrate and a film of an HTSC material, by means of which the carbon-containing substrate is protected from oxidation and other adverse affects incident to environmental exposure thereof, and the superconductor constituent in turn is protected from deterioration as a result of degradative interactions with the substrate.

Although the ensuing discussion is directed by way of illustration to diamond substrates, it is to be appreciated that the utility of the invention is not thus limited, but rather extends to any other carbon-containing substrate materials of construction which may benefit from the presence of an interlayer between the substrate and an HTSC film supported by such substrate. Examples of such other carbon-containing materials, suitable for use in substrates in the broad practice of the present invention, include graphite and metal carbides such as silicon carbide, titanium carbide, etc. It will be appreciated that the substrate may comprise alloys, blends, mixtures, and composites of suitable carbon-containing materials, and that the carbon-containing material substrate may be formed or otherwise provided on another material layer or body, as necessary or desirable in a given application to yield the superconducting thin film composite product article. The substrate may be in bulk or thin film form. The most preferred substrate material is diamond, and the ensuing description will be directed to diamond, subject to the foregoing caveat concerning the broad applicability of the invention.

The choice of the material for the interlayer is critical to the successful deposition of the HTSC layer on the diamond substrate. Functionally, the interlayer must satisfy the following criteria:

(1) the interlayer material must react with the diamond surface to form a good bond therewith, or else the interlayer must physically adhere to the diamond surface sufficiently strongly under the conditions of fabrication and use of the composite to maintain good physical integrity of the composite;

(2) the interlayer must have a thermal expansion coefficient intermediate to the thermal expansion coefficients of diamond and the HTSC material;

(3) the interlayer must provide a suitable surface for HTSC layer formation thereon, either by precursor deposition and annealing thereon, or by in situ growth techniques, or it must form a stable oxide which provides such suitable surface;

(4) the interlayer material or its oxide must form a barrier to oxygen diffusion; and (5) the interlayer must permit deposition and annealing of the metal oxide film so that it will become superconducting, i.e., the interlayer material must not deleteriously react with the HTSC material under conditions of deposition or annealing.

As a further criterion in many device applications, the interlayer film must also be kept very thin. For example, in the application of the present invention to fabrication of bolometers, thinness is desired to avoid degradation of the detector response time as a result of the total heat capacity of the detector being increased by the presence of the interlayer.

Materials which have been discovered to meet the foregoing criteria include zirconium, yttrium, and niobium, each of which forms stable oxides.

Zirconium is a preferred metal material for use in the interlayer. The zirconium metal will react with diamond to form a thin zirconium carbide (ZrC) reaction zone (interlayer portion or sub-layer) at the interface between the diamond surface and the zirconium film. The zirconium surface which will be in contact with the superconductor can be oxidized to form zirconium oxide ($ZrO_2$) and thus forms a diffusion barrier, with the zirconium oxide sub-layer or portion of the interlayer preventing oxygen from permeating to the diamond surface. The thermal expansion coefficients of zirconium carbide, zirconium, and zirconium oxide are on the order $a_{ZrC} < a_{Zr} < a_{ZrO_2}$ and such thermal expansion coefficients all are intermediate between the thermal expansion coefficients of diamond and the metal oxide superconductors.

The foregoing metal constituents, zirconium, yttrium, and niobium, may be utilized to form the interlayer in combinations of any two of such metals, or all three metals, in suitable forms such as alloys, blends, eutectics, etc. In this respect, it is to be noted that YBaCuO films have previously been successfully grown on yttria-stabilized-zirconia (see Kwanski, R. F., et al, "Microstructure and properties of superconducting sputter deposited Y-Ba-Cu-O films," *J. Mat. Res.*, 1989, 4, 257).

It is within the purview of the present invention to provide an interlayer formed of two or more constituent sub-layers, as in the zirconium carbide/zirconium/zirconium oxide interlayer illustratively described hereinabove.

In the case of some of the aforementioned metals which may be otherwise useful for forming the interlayer, a simple stable oxide cannot be formed directly by oxidation of the metal surface on the deposited metal film or another oxide may be a preferable substrate. In such case, a multilayer interlayer structure comprising metal and metal oxide constituent sub-layers may be employed, wherein the multilayer composite structure comprises diamond/metal/metal oxide/HTSC materials. As an example, an interlayer structure could be formed by deposition of a metal film on the diamond substrate surface, followed by heat treatment of the interlayer to form a metal carbide reaction layer at the diamond-metal interface, followed by deposition of a thin layer of a metal oxide, which may be a metal oxide of the underlying interlayer metal, or alternatively an oxide of a different metal, onto the interlayer metal surface, followed by deposition of the HTSC overlayer, and subsequent annealing steps as previously discussed. Such separate metal and metal oxide layer deposition technique has the advantage of avoiding fragmentation of the metal surface which can result from formation of the metal oxide thereon. For example, in the case of zirconium as the metal constituent of the interlayer, fragmentation of the zirconium metal by oxide formation may lead to weak interfacial adhesion between the interlayer and diamond substrate surface, and pinhole formation through the metal film, resulting in oxidation of the underlying diamond substrate.

Another class of interlayer materials which may be employed in the broad practice of the present invention is the group consisting of platinum, palladium, iridium, gold, and silver. The most preferred metal species from such group is platinum, which shows virtually no interaction with the metal oxide superconductors and has little interaction with the diamond surface. Platinum has been found to be a highly suitable substrate material for superconductor oxide growth. Platinum does not react with the diamond substrate, and thus interlayers formed of platinum must be physically adhered to the diamond surface. Other metals that do not react with the diamond surface but may physically adhere to a sufficiently strong extent at the relevant temperatures are iridium, gold, and silver. Gold and silver are generally useful only at relatively low temperatures, on the order of less than 850° C. In the case of bismuth HTSC overlayers and thallium HTSC overlayers, silver is particularly usefully employed as the interlayer metal. The choice of a specific interlayer metal from the foregoing group may readily be determined by those of ordinary skill in the art without undue experimentation, by the simple expedient of adhesion tests, electron microscope inspection of the interlayer-coated substrate, and electrical resistivity measurement of the metal oxide HTSC material formed thereon.

Thus, in the broad practice of the present invention, the interlayer may comprise a material selected from the group consisting of: zirconium; yttrium; niobium; zirconium carbide; yttrium carbide; niobium carbide; zirconium oxide; yttrium oxides; niobium oxide; platinum; iridium; gold; silver; palladium; and combinations of two or more of such members. Preferably, the interlayer is formed of zirconium-based material, comprising a zirconium carbide sub-layer at the interface with the carbon-containing substrate, and a sub-layer of zirconium oxide at the interface with the HTSC material, and with the intermediate sub-layer portion of the interlayer being zirconium metal.

As used in the preceding paragraph, the term "combinations" is intended to be broadly construed to include alloys, blends, eutectics, admixtures, intermetallics, and any other compositions conjointly including any of the metal, metal carbide, and/or metal oxide constituents of the above-described group thereof.

In bolometer applications, the interlayer in the multilayer structure of the present invention must be maintained at a very low thickness, generally from about 10 nanometers (nm) to about 1000 nm in thickness, with thicknesses on the order of from about 20 nm to about 200 nm being preferred, and thicknesses of from about 50 nm to about 100 nm being most preferred. The interlayer in the bolometer application must be kept as thin as possible, to avoid substantially increasing the heat capacity of the bolometer device. At the same time, the interlayer must be sufficiently thick to prevent oxidation of the diamond substrate during the oxygen annealing of the superconductor film. The interlayer also needs to provide some degree of thermal expansion matching between the diamond and the metal oxide superconductor, while being substantially non-reactive with the components of the superconductor. Zirconium is a preferred metal constituent of the interlayer, and has been utilized effectively with HTSC materials of the YBaCuO as well as BiSrCaCuO type.

The improvement of the invention does not depend on the specific methods employed for forming the various constituent layers of the multilayer article, since the key factor is the survivability of the diamond component during the annealing conditions that are required to render the HTSC film superconducting in character. The invention does not depend on any specific HTSC material being employed, since the same problems which are overcome by the interlayer of the present invention will be encountered in all metal oxide HTSC materials.

Thus, any HTSC materials may be employed in the HTSC overlayer of the multilayer composite of the present invention.

Preferred HTSC materials which are useful in the broad practice of the present invention include perovskite metal oxide superconductors comprising admixtures of metals from Groups IB, IIA, and IIIB of the Periodic Table. A specific class of such materials is that of the formula $R_1Ba_2Cu_3O_y$, the so-called "123" high temperature superconductors, wherein y is from about 6 to about 7.1, preferably from about 6.4 to about 7.1, and R is selected from the group consisting of Y, Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, as well as corresponding compounds wherein Ba is substituted by Sr-Ca, Ba-Sr, or Ba-Ca. Another class of metal oxide superconductors suitable for use in the present invention are those of the formula $(AO)_mM_2Ca_{n-1}Cu_nO_{2n+2}$ where the A cation can be Tl, Pb, Bi, or a mixture of these elements, m=1 or 2 (but m is only 2 when A is Bi), n is from 1 to 5, the M cation is Ba or Sr, and Ca may be substituted by Sr. Specific metal oxide superconductor compositions are described in "High Tc Oxide Superconductors," M. B. Maple, MRS Bulletin, January, 1989, pages 20-21, "High $T_c$ Bismuth and Thallium Copper Oxide Superconductors," A. W. Sleight, et al, MRS Bulletin, January, 1989, pages 45-48. In the broad practice of the present invention, the HTSC films can be formed by any suitable techniques, including for example laser ablation, sputtering, evaporation, MOCVD, sol-gel processing, or any other techniques capable of forming a film of the appropriate superconductor or superconductor precursor material on the surface of the interlayer.

The diamond substrate in the broad practice of the present invention may be constituted by a bulk diamond crystal, or it may be a single crystal or polycrystalline diamond film. Diamond films are suitably prepared by plasma or hot filament assisted chemical vapor deposition techniques which are well known in the art.

The interlayer may be formed on the diamond surface by any suitable method, including evaporation, chemical vapor deposition, and sputtering techniques.

Figure 4:
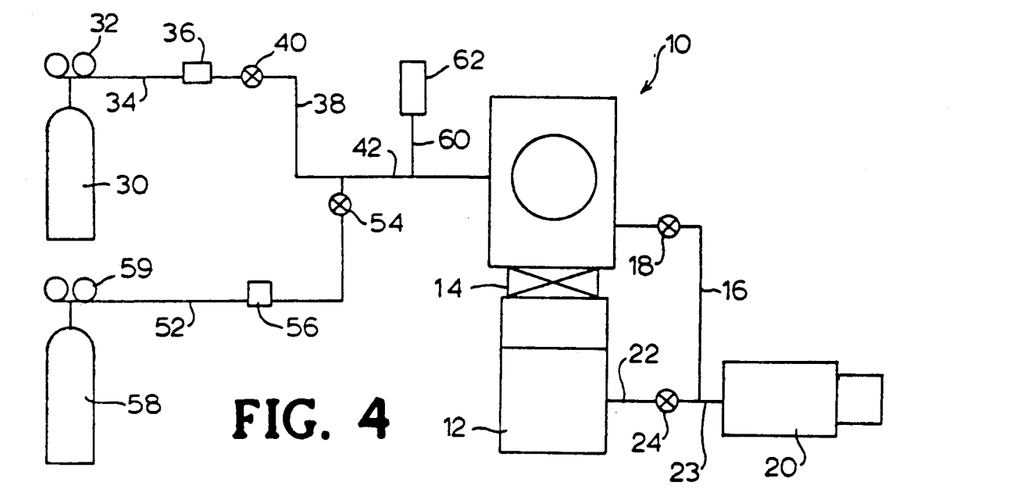
FIG. 4 is a schematic representation of a hot filament-assisted CVD diamond film formation process system.

FIG. 4 shows a schematic representation of a chemical vapor deposition process system in which diamond may be applied to a support to form a substrate for successive interlayer and HTSC overlayer formation thereon. As illustrated, the system comprises a chemical vapor deposition growth chamber 10 communicating with a diffusion pump 12 by means of plenum connection 14. The growth chamber 10 is joined by means of conduit 16, having valve 18 disposed therein, and conduit 23, to a roughing pump 20. Conduits 16 and 23 are also joined to diffusion pump 12 by means of conduit 22 having valve 24 disposed therein.

The system comprises a source means 30 for carrier gas, which has associated therewith a regulator assembly 32, and conduit 34 joining the regulator assembly with a mass flow controller 36. The mass flow controller 36 is joined by conduit 38, having control valve 40 therein, to a source gas mixture feed conduit 42.

Joined to the source gas mixture feed conduit 42, by means of carbon source gas feed conduit 52, having valve 54 and mass flow controller 56 disposed therein, is a regulator assembly 59 associated with a carbon source gas supply means 58. The source gas mixture feed conduit 42 is also joined by means of branch conduit 60 to a mass spectrometer 62.

Figure 5:
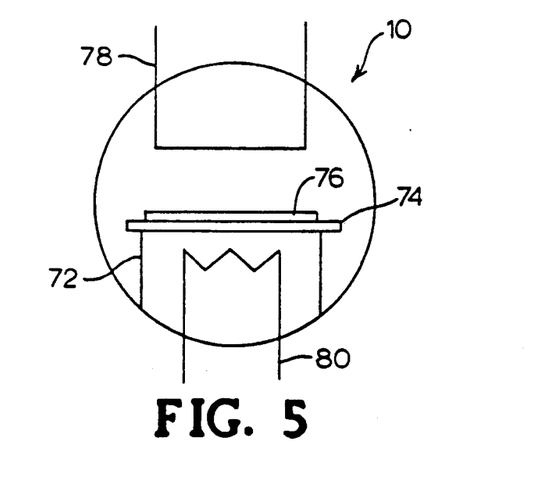
FIG. 5 is a schematic representation of an enlarged portion of the growth chamber of the FIG. 4 process system.

FIG. 5 shows a simplified schematic representation of the layout of the chemical vapor deposition growth chamber 10 containing a deposition platform 72, on the top face of which is mounted a substrate support element 74 for supportively reposing thereon a substrate 76. Overlying the substrate and in close proximity thereto is a heating filament 78. The heating filament 78 and substrate heating element 80 are suitably joined to appropriate energizing means (not shown) for actuating these heating members to effect heating.

To prepare the system for operation, the chemical vapor deposition growth chamber 10 is evacuated to a suitable low pressure, to substantially remove all holdup gas contained therein. The growth chamber is initially rough-pumped to a pressure which may for example be on the order of about $10^{-3}$ millimeters Hg, by actuating the roughing pump 20, with valve 18 in conduit 16 and valve 24 in conduit 22 being open, so that the growth chamber 10, plenum connection 14, and diffusion pump 12 are all evacuated to the desired low pressure level. Subsequent to achievement of the desired rough-pumped pressure level, valve 18 in conduit 16 and valve 24 in conduit 22 are closed. The diffusion pump 12 then is activated to further reduce the vacuum pressure level in growth chamber 10 to a level on the order of $10^{-7}$ Hg. Once the growth chamber has been thus evacuated, it is ready to receive the source gas mixture, when the chamber has been brought to proper elevated temperature.

In operation, a substrate 76 is placed on the substrate support element 74 of the deposition platform 72, and the substrate heating element 80 is activated to heat the substrate 76 to a suitable temperature, e.g., on the order of from about 400° C. to about 1050° C.

Concurrently, the heating filament 78 is energized to bring same to a suitable temperature for carrying out chemical vapor deposition, e.g., a temperature on the order of from about 1800° C. to about 2500° C.

The regulator assembly is opened and hydrogen gas from the carrier gas source means 30 is flowed through conduits 34 and 38 (valve 40 being opened) to conduit 42.

The regulator assembly 59 of carbon source gas supply means 58 concurrently is opened to flow methane, as the carbon source compound for diamond film formation, through conduit 52 to the source gas mixture feed conduit 42, valve 54 in conduit 52 being open. Mass flow controller 56 in conduit 52 monitors the mass flow rate of the methane gas and maintains a predetermined mass flow rate of methane.

Thus, the hydrogen carrier gas and the carbon source compound are mixed with one another in conduit 42 to form the chemical vapor deposition source gas mixture. The respective carrier gas mass flow controller 36 and the carbon source mass flow controller 56 are suitably operated to provide a desired source gas mixture composition in conduit 42, e.g., 99.5% hydrogen and 0.5% methane on a total gas mixture volume basis.

This source gas mixture may be selectively sampled by withdrawal from feed conduit 42 in branch conduit 60 for analysis in mass spectrometer 62, to ensure that the source gas mixture entering the chemical vapor deposition growth chamber 10 is of the desired composition.

The source gas mixture for the diamond film then is flowed into the chemical vapor deposition growth chamber 10 at a flow rate which may for example be on the order of from about 20 to about 250 cubic centimeters per minute, and at a total gas pressure which may be on the order of from about $10^{-4}$ to about 300 Torr.

The hot filament 78 may be spaced from the substrate 76 in the growth chamber at a distance on the order of from about 0.2 to about 2 centimeters.

The source gas mixture entering the growth chamber 10 is heated by the filament 78 to effect decomposition of the methane (carbon source gas) to form atomic carbon and atomic hydrogen therefrom, the carbon depositing on the substrate 76 to form diamond and the atomic hydrogen deriving from the methane, as well as from the hydrogen carrier gas, serving to selectively remove any graphite which may be formed in the growing diamond film.

There is resultingly produced a diamond layer of high quality which may be usefully employed as a substrate for successive formation of the interlayer and HTSC overlayer thereon.

The features and advantages of the invention are more fully illustrated by the following non-limited examples, wherein all parts and percentages are by weight, unless otherwise expressly stated.

EXAMPLE 1

Silicon/Diamond/Zr/YBaCuO Composite

Diamond Film Growth

Diamond film growth onto a Si(100) 2-inch diameter wafer was performed by hot filament assisted chemical vapor deposition from dilute methane in hydrogen gas mixtures, utilizing a deposition system of the type shown in FIG. 4, with a stainless steel UHV reaction chamber pumped by a liquid nitrogen trapped diffusion pump. The substrate was mounted on a molybdenum holder which was heated by a graphite resistance heater. A tungsten filament was supported over the substrate surface at distances on the order of 5–mm. Gas flow into the reactor was controlled by mass flow controllers and the pressure in the reactor during film growth was controlled by pumping through a UHV leak valve. The growth conditions which were employed in the diamond film formation are set out in Table I below.

TABLE I

| Total Pressure | 10 torr |
|---|---|
| Substrate Temperature | 800° C. |
| Hydrogen Flow Rate | 99.5 cm³/min. |
| Methane Flow Rate | 0.5 cm³/min. |
| Filament Temperature | 2000° C. |

The Si(100) two-inch diameter wafer prior to growth was given the following cleaning procedure: (1) degreasing in Transene ultrasonic detergent (~5 min), (3) ultrasonic washing in Transene 100 for ~5 min, (4) transfer to a fresh Transene 100 solution where the sample remained until it was ready to be transferred to the growth reactor.

In order to enhance nucleation of the diamond film, the silicon wafer was polished with 0.25 micron diamond paste for ~1 hour. The wafer then was polished several times with increasingly smaller grit size diamond paste, e.g., 6 micron diameter grit paste followed by 1 micron diameter grit paste followed by 0.25 micron diameter grit paste. The polished wafer was rinsed thoroughly in de-ionized water and then given the cleaning procedure described in the preceding paragraph. This polishing step considerably enhanced the nucleation rate of the diamond film and permitted continuous polycrystalline film formation to be achieved.

Interlayer Formation

The zirconium interlayer was formed on the diamond surface by sputter deposition from a zirconium target at a pressure of approximately $10^{-3}$ torr. The resulting interlayer was about 2000 Angstroms thick.

HTSC Film Growth

A YBaCuOF thin film was deposited on the interlayer in a reactor system comprising a horizontal growth tube with an infrared heated SiC susceptor. The reactor system was of a type as more fully described in Kirlin, P. S.; Binder, R.; Gardiner, R.; and Brown D. W.; "Growth of high $T_c$ YBaCuO thin films by metalorganic chemical vapor deposition," *SPIE Proc.; Processing of Films for High $T_c$ Superconducting Electronics,* Vol. 1187 (1989), 115-127, the disclosure of which hereby is incorporated herein by reference. The growth conditions shown in Table II below were employed in forming the HTSC precursor film.

TABLE II

| Ba Delivery (micromole/min) | 132 |
|---|---|
| Y Carrier (cm³/min) | 14.0 |
| Y Bubbler Temp (°C.) | 140 |
| Cu Carrier (cm³/min) | 17.6 |
| Cu Bubbler Temp (°C.) | 45 |
| Growth Rate (mg/cm²/min) | 0.159 |
| Stoichiometric Ratio (Y:Ba:Cu) | 1:2:3 |

The as-deposited film was an amorphous mixture of oxides and fluorides. Scanning electron microscopy revealed that the diamond film remained intact during the growth of the YBaCuOF film.

YBaCuO Annealing Process

The annealing of the YBaCuOF film was carried out with the following sequence of steps:

1. Heating from room temperature to 750° C. in flowing argon saturated with water, at a flow rate of 15° C./min.
2. Holding at 750° C. for 39 minutes in the argon/water environment.
3. Turning the water flow off, and cooling to 700° C. at a rate of 15° C./min.
4. Holding the temperature at 700° C. for 4.5 hours in argon atmosphere.
5. Turning the argon flow off, and the oxygen flow on, and cooling to 500° C. in flowing oxygen, at a rate of 3° C./min.
6. Holding at 500° C. for 12 hours in oxygen atmosphere.
7. Quenching to room temperature.

Results

Figure 6:
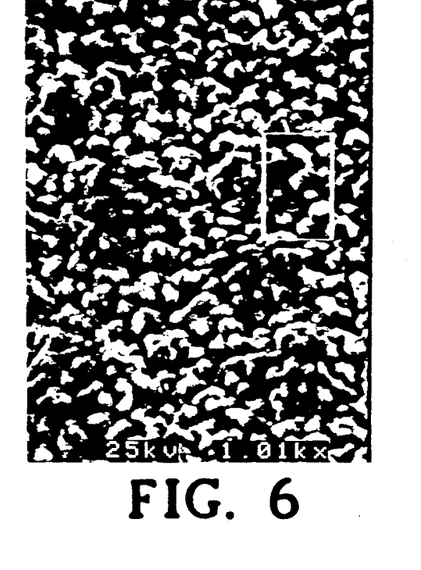
FIG. 6 is an SEM micrograph of a YBaCuO/zirconium/-diamond/Si composite after low temperature annealing thereof at temperature of about 750° C. (maximum temperature), taken at a voltage of 25 KV and a magnification of 10 times.
Figure 7:
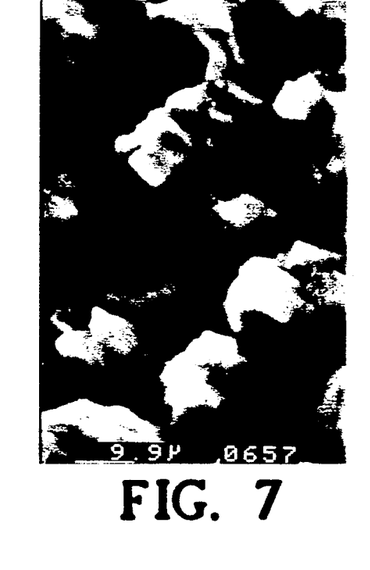
FIG. 7 is an enlargement of the portion of the FIG. 6 micrograph bounded by the rectangular shape in the right-hand middle portion thereof, with the scale of the micrograph enlargement being shown by the line in the bottom left-hand portion of FIG. 7, representing a distance of 9.9 microns.
Figure 8:
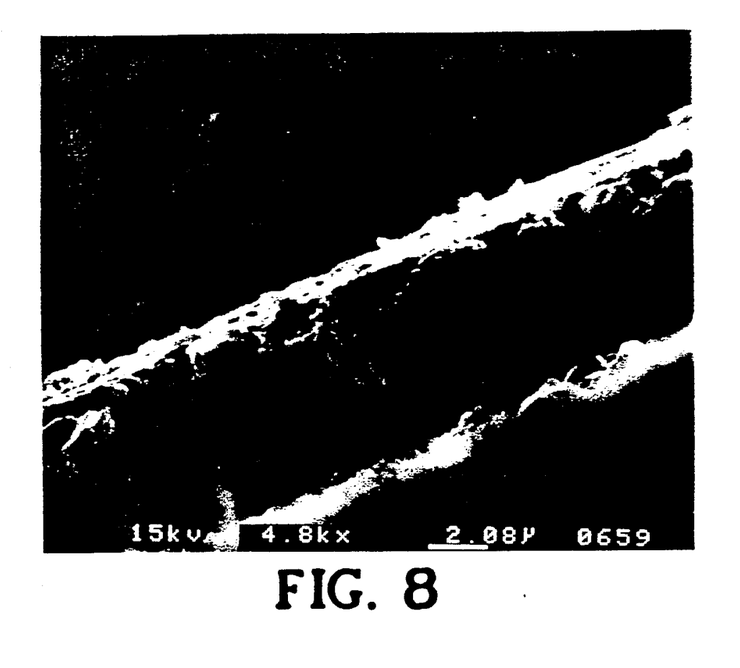
FIG. 8 is an SEM micrograph of a multilayer composite comprising YBaCuO on a zirconium interlayer on a diamond-coated silicon substrate, after annealing of the article at 890° C.

The low temperature annealing process outlined above had been shown to be effective for YBaCuOF films deposited on MgO(100) substrates. However, dramatically different YBaCuO film morphologies were observed between the MgO(100) (not shown) and the zirconium-passivated diamond thin film of this example (see FIGS. 6 and 7). The YBaCuO film on the zirconium-passivated diamond thin film was highly resistive. EDS analysis indicated that all the fluorine was not removed, and that fluorine and oxygen were present in approximately equal concentrations in the post-annealed film. These results are consistent with the formation of an insulating $YBa_2Cu_3F_4O_{3.5}$ phase (see Suer, N. N., et al., "Fluoridation of the high-$T_c$ superconductors YBa$_2$Cu$_3$O$_{7-x}$ and GdBa$_2$Cu$_3$O$_{7-x}$." *J. Mater. Res.*, 1988, 3, 813). Further annealing studies indicated that temperatures exceeding 850° C. were required to completely strip the fluorine from the HTSC films deposited on the Zr barrier layer. At temperatures below 890° C., the Zr remained effective at protecting the underlying diamond film over most of the substrate, as shown by the EM micrograph of FIG. 8.

EXAMPLE 2

Silicon/Diamond/Zr/BiSrCaCuO Composite

Diamond film growth and Zr interlayer formation were carried out as described in Example 1. A BiSrCaCuOF film was deposited in a growth system which was similar to that employed in Example 1, but which utilized an inverted vertical reaction chamber. The growth conditions shown in Table III below were employed to form the HTSC precursor film.

TABLE III

| No. # | SC5 |
|---|---|
| Ca delivery (micromole/min) | 287 |
| Sr delivery (micromole/min) | 325 |
| Bi carrier* (cm$^3$/min) | 25 |
| Cu carrier* (cm$^3$/min) | 32 |
| Growth Rate$^s$ (mg/min-cm$^2$) | 1.64 |
| Stoichiometric Ratio (BiSrCaCu) | 2:2.4:1.9:3.8 |

*Bismuth bubbler held at 180° C.; copper bubbler held at 60° C.; substrate is Si(100)
$^s$Normalized to the area of a 2 inch diameter silicon wafer (20.3 cm$^2$)

BiSrCaCuO Annealing Process

The annealing of the HTSC precursor film comprised the following sequential steps:
1. Heating to 870° C. at a rate of 30° C./min in flowing oxygen saturated with water at 20° C.
2. Holding at 870° C. for 2 hours in wet oxygen; switching the water flow off, and maintaining the oxygen flow for an additional 3 hours.
3. Cooling to room temperature, in flowing oxygen at 30° C./min.

Results

Figure 9:
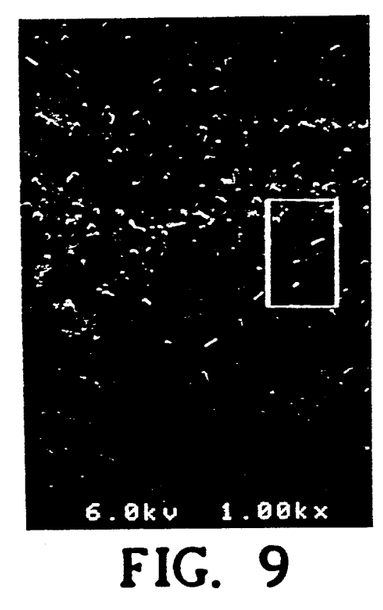
FIG. 9 is an electron microscope (EM) micrograph of a BiSrCaCuO film on a Zr/diamond/silicon substrate, taken at a voltage of 6.0 KV and magnification of 1000 times.
Figure 10:
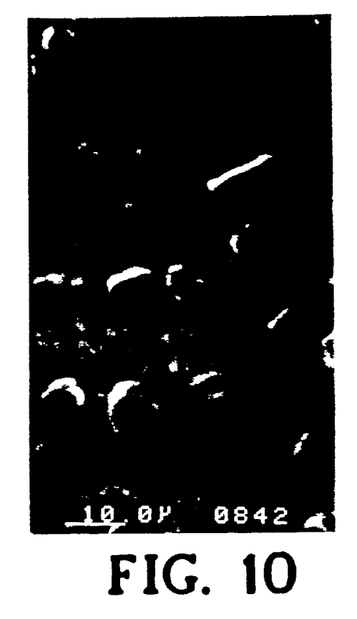
FIG. 10 is an enlargement of the portion of the FIG. 9 EM micrograph which is demarcated by the rectangular outline in the right central portion thereof.

The BiSrCaCuO film on the Zr/diamond/silicon substrate is shown in FIGS. 9 and 10.

In evaluation of the composite articles produced in the foregoing Examples, it was found that pinholes or other small defects caused catastrophic failures in the barrier layers (interlayers). Furthermore, Zr was found throughout the YBaCuO and BiSrCaCuO films annealed above 835° C. and the underlying Zr layers were enriched in Cu. This result can be expected for all Cu-based high temperature superconductors on the basis of the Cu-Zr phase diagram, which shows that at temperatures above 823° C., Zr and Cu will react to form a wide variety of transition metal alloys. However, results from annealing studies of YBaCuO films deposited on yttria-stablized-zirconia demonstrate that the ZrO$_2$ layer is compatible with the HTSC film (see Kwanski, R. F. et al.; "Microstructure and properties of superconducting sputter deposited Y-Ba-Cu-O films." *J. Mat. Res.*, 1989, 4, 257). Thus, preoxidation of the Zr barrier layer or deposition of an additional ZrO$_2$ layer is desirably employed to passivate the Zr surface. Using ZrO$_2$ as an immediate substrate on the base substrate (diamond) material, superconducting YBaCuO, BiSrCaCuO, and TlBaCaCuO thin films can be grown on diamond.

In the foregoing illustrative examples, silicon has been employed as a base material in the support substrate structure. Silicon is used as a material of construction in such support structure since it is readily formed by known and well-established forming and processing technology. Diamond is used as a substrate layer on the silicon support in the support substrate structure since thermal properties close to those of single-crystal diamond can be obtained.

Figure 11:
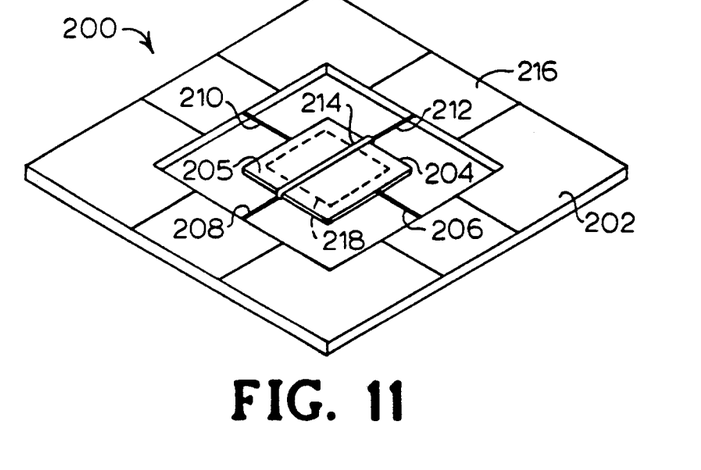

FIG. 11 shows a perspective schematic view of a bolometer 200. The bolometer comprises a silicon support frame 202, with a diamond film support 204 disposed on the silicon support frame 202 by means of silicon support threads 206, 208, 210, and 212. The diamond film support 204 has an interlayer 205 thereon. The interlayer may suitably comprise a material selected from the group consisting of: zirconium; yttrium; niobium; zirconium carbide; yttrium carbide; niobium carbide; zirconium oxide; yttrium oxide; niobium oxide; platinum; palladium; iridium; gold; silver; or combinations of two or more of the foregoing materials.

An overlayer 214 is provided on the interlayer 205. The overlayer is formed of a thin film HTSC material, e.g., TlBaCaCuO superconductor material, defining an HTSC transition edge thermometer. Gold/chromium thermometer contact pads 216 are provided on the top surface of the support frame 202, as shown. An absorber film 218 of a thin metal is provided on one side of the HTSC transition edge thermometer (on the underside of diamond film support 204).

It will be recognized that the support frame, support, interlayer, overlayer, and absorber film materials of construction may be widely varied, in accordance with the broad disclosure of the invention herein.

While the invention has been described herein with reference to specific aspects, features, and embodiments, it will be apparent that other variations, modifications, and embodiments are possible, and all such variations, modifications, and embodiments therefore are to be regarded as being within the sprit and scope of the invention.

What is claimed is:
1. A multilayer superconducting thin film composite article, comprising:
   (a) a carbon-containing substrate;
   (b) an interlayer comprising a material selected from the group consisting of: zirconium; yttrium; niobium; zirconium carbide; yttrium carbide; niobium carbide; zirconium oxide; yttrium oxide; niobium oxide; platinum; iridium; gold; silver; palladium; and combinations of two or more of the foregoing materials; and
   (c) an overlayer comprising a HTSC material.
2. A multilayer superconducting thin film composite article according to claim 1, wherein the substrate comprises a material selected from the group consisting of diamond, silicon carbide, titanium carbide, graphite, and combinations thereof.
3. A multilayer superconducting thin film composite article according to claim 1, wherein the interlayer comprises a material selected from the group consisting of: zirconium; yttrium; niobium; zirconium carbide; yttrium carbide; niobium carbide; zirconium oxide; yttrium oxide; niobium oxide; and combinations of two or more of the foregoing materials.

4. A multilayer superconducting thin film composite article according to claim 1, wherein the interlayer comprises a material selected from the group consisting of platinum, iridium, gold, palladium, and silver.

5. A multilayer superconducting thin film composite article, comprising:
   (a) a carbon-containing substrate;
   (b) an overlayer comprising an HTSC material;
   (c) an interlayer comprising a zirconium oxide sub-layer at the interface with the overlayer, an intermediate sub-layer of zirconium, and a zirconium carbide sub-layer at the interface with the carbon-containing substrate.

6. A multilayer superconducting thin film composite article according to claim 1, wherein the overlayer is formed of an HTSC material of the formula $R_1M_2Cu_3O_y$, wherein R is selected from Y, Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, wherein M is selected from the group consisting of Ba, Sr-Ca, Ba-Sr, and Ba-Ca, and wherein y is a number of from about 6.0 to about 7.1.

7. A multilayer superconducting thin film composite article according to claim 1, wherein the overlayer is formed of an HTSC material of the formula $YBa_2Cu_3O_y$, wherein y is a number of from about 6.4 to about 7.1.

8. A multilayer superconducting thin film composite article according to claim 1, wherein the overlayer is formed of an HTSC material of the formula $(AO)_mM_2G_{n-1}Cu_nO_{2n+2}$, wherein A is selected from Tl, Pb, and Bi, or a mixture of such elements; m = 1 or 2, with a proviso that m = 2 only when A is Bi; n is an integer having a value of from 1 to 5; M is Ba or Sr; and G is selected from Ca and Sr.

9. A multilayer superconducting thin film composite article according to claim 1, wherein the HTSC material is a 123 ceramic oxide superconductor.

10. A multilayer superconducting thin film composite article according to claim 1, wherein the substrate comprises diamond.

11. A multilayer superconducting thin film composite article according to claim 8, wherein A is Bi; M is Sr; and G is Ca.

12. A multilayer superconducting thin film composite article according to claim 8, wherein A is Tl; M is Ba; and G is Ca.

13. A multilayer superconducting thin film composite article according to claim 1, wherein the substrate comprises a thin film of diamond on a silicon base element.

14. A multilayer superconducting thin film composite article according to claim 1, wherein the overlayer is formed by deposition on the interlayer of a YBaCuOF film which is annealed in an oxygen-containing environment at elevated temperture to form a $YB_2Cu_3O_{7-x}$ film, wherein x is a number from about 0 to about 1.

15. A multilayer superconducting thin film composite article according to claim 1, wherein the substrate comprises diamond deposited by chemical vapor deposition.

16. A multilayer superconducting thin film composite article according to claim 1, wherein the HTSC material is formed by MOCVD deposition of the HTSC material, or a precursor thereof which is annealed in an oxygen-containing environment to form the HTSC material.

17. A multilayer superconducting thin film composite article according to claim 5, wherein the substrate comprises a material selected from the group consisting of diamond, silicon carbide, titanium carbide, graphite, and combinations thereof.

18. A multilayer superconducting thin film composite article according to claim 5, wherein the overlayer comprises an HTSC material selected from the group consisting of:
   (i) HTSC materials of the formula $R_1M_2Cu_3O_y$, wherein R is selected from Y, Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, wherein M is selected from the group consisting of Ba, Sr-Ca, Ba-Sr, and Ba-Ca, and wherein y is a number of from about 6.0 to about 7.1; and
   (ii) HTSC materials of the formula $(A))_mM_2G_{n-1}Cu_nO_{2n+2}$, wherein A is selected from Tl, Pb, and Bi, or a mixture of such elements; m = 1 or 2, with a proviso that m = 2 only when A is Bi; n is an integer having a value of from 1 to 5; M is Ba or Sr; and G is selected from Ca and Sr.

19. A multilayer superconducting thin film composite article according to claim 1, wherein the interlayer comprises a metal sub-layer and a metal oxide sub-layer wherein the metal and metal oxide are selected from said group, and wherein the overlayer in disposed on the metal oxide sub-layer.

20. A multilayer superconducting thin film composite article according to claim 1, wherein the interlayer comprises a metal oxide sub-layer at the interface with the overlayer, an intermediate sub-layer of metal, and a metal carbide sub-layer at the interface with the carbon-containing substrate, wherein the metal, the metal carbide, and the metal oxide are selected from said group.

21. A multilayer superconducting thin film composite article, comprising:
   (a) a substrate comprising diamond;
   (b) an overlayer comprising an HTSC material selected from the group consisting of:
      (i) HTSC materials of the formula $R_1M_2Cu_3O_y$, wherein R is selected from Y, Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, wherein M is selected from the group consisting of Ba, Sr-Ca, Ba-Sr, and Ba-Ca, and wherein y is a number of from about 6.0 to about 7.1; and
      (ii) HTSC materials of the formula $(AO)_mM_2G_{n-1}Cu_nO_{2n+2}$, wherein A is selected from Tl, Pb, and Bi, or a mixture of such elements; m = 1 or 2, with a proviso that m = 2 only when A is Bi; n is an integer having a value of from 1 to 5; M is Ba or Sr; and G is selected from Ca and Sr; and
   (c) an interlayer comprising a zirconium oxide sub-layer at the interface with the overlayer, an intermediate sub-layer of zirconium, and a zirconium carbide sub-layer at the interface with the carbon-containing substrate.

22. A multilayer superconducting thin film composite article, comprising:
   (a) a carbon-containing substrate, comprising a material selected from the group consisting of diamond, silicon carbide, titanium carbide, graphite, and combinations thereof;
   (b) an interlayer comprising a material selected from the group consisting of: zirconium; yttrium, niobium; zirconium carbide; yttrium carbide; niobium carbide; zirconium oxide; yttrium oxide; niobium oxide; platinum; iridium; gold; silver; palladium; and combinations of two or more of the foregoing materials; and (c) an overlayer comprising an HTSC material selected from the group consisting of:
  (i) HTSC materials of the formula $R_1M_2Cu_3O_y$, wherein R is selected from Y, Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, wherein M is selected from the group consisting of Ba, Sr-Ca, Ba-Sr, and Ba-Ca, and wherein y is a number of from about 6.0 to about 7.1; and
  (ii) HTSC materials of the formula $(AO)_mM_2G_{n-1}Cu_nO_{2n+2}$, wherein A is selected from Tl, Pb, and Bi, or a mixture of such elements; m=1 or 2, with a proviso that m=2 only when A is Bi; n is an integer having a value of from 1 to 5; M is Ba or Sr; and G is selected from Ca and Sr.

23. A multilayer superconducting thin film composite article according to claim 1, wherein the interlayer has a thickness of from about 10 nanometers to about 1000 nanometers.

24. A bolometer, comprising
 (i) a silicon support frame;
 (ii) a diamond film support on the silicon support frame;
 (iii) an interlayer on the diamond film support, comprising a material selected from the group consisting of: zirconium; yttrium; niobium; zirconium carbide; yttrium carbide; niobium carbide; zirconium oxide; yttrium oxide; niobium oxide; platinum; iridium; palladium; gold; silver; and combinations of two or more of the foregoing materials;
 (iv) an overlayer on the interlayer, formed of a thin film HTSC material defining an HTSC transition edge thermometer, wherein the HTSC material is selected from the group consisting of:
  (a) HTSC materials of the formula $R_1M_2Cu_3O_y$, wherein R is selected from Y, Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, wherein M is selected from the group consisting of Ba, Sr-Ca, Ba-Sr, and Ba-Ca, and wherein y is a number of from about 6.0 to about 7.1; and
  (b) HTSC materials of the formula $(AO)_mM_2G_{n-1}Cu_nO_{2n+2}$, wherein A is selected from Tl, Pb, and Bi, or a mixture of such elements; m=1 or 2, with a proviso that m=2 only when A is Bi; n is an integer having a value of from 1 to 5; M is Ba or Sr; and G is selected from Ca and Sr; and
 (v) an absorber film of a thin metal on one side of the HTSC transition edge thermometer.

* * * * *

UNITED STATES PATENT AND TRADEMARK OFFICE
CERTIFICATE OF CORRECTION

PATENT NO. : 5,122,509
DATED : June 16, 1992
INVENTOR(S) : Charles P. Beetz, Jr., et al It is certified that error appears in the above-identified patent and that said Letters Patent is hereby corrected as shown below:

Column 11, line 29, change "5--mm" to --5-15mm--.

Column 15, line 55, change "temperture" to --temperature--.

Signed and Sealed this

Thirty-first Day of August, 1993

Attest:

BRUCE LEHMAN

*Attesting Officer*   *Commissioner of Patents and Trademarks*